United States Patent [19]

Sakato

[11] Patent Number: 4,712,910
[45] Date of Patent: Dec. 15, 1987

[54] EXPOSURE METHOD AND APPARATUS FOR SEMICONDUCTOR FABRICATION EQUIPMENT

[75] Inventor: Keiichiro Sakato, Kawasaki, Japan
[73] Assignee: Nippon Kogaku K.K., Tokyo, Japan
[21] Appl. No.: 925,487
[22] Filed: Oct. 29, 1986

Related U.S. Application Data

[63] Continuation of Ser. No. 688,599, Jan. 3, 1985, abandoned.

[30] Foreign Application Priority Data

Jan. 5, 1984 [JP] Japan ................................ 59-487
Jan. 9, 1984 [JP] Japan ................................ 59-763

[51] Int. Cl.[4] ....................... G03B 27/72; G03B 27/42
[52] U.S. Cl. ................................ 355/53; 355/68; 355/69
[58] Field of Search ................ 355/53, 67, 71, 68, 355/69, 43, 45, 30, 86, 95; 354/250-254; 315/151, 241 P

[56] References Cited

U.S. PATENT DOCUMENTS

| Re. 30,571 | 4/1981 | Bachur et al. ........... 355/69 X |
|---|---|---|
| 3,630,136 | 12/1971 | Kitai ........................ 354/459 |
| 3,702,732 | 11/1972 | Sliwkowski ............. 355/69 X |
| 3,705,764 | 12/1972 | Reinsch ................... 352/169 X |
| 3,888,583 | 6/1975 | Keifer et al. ............ 355/69 X |
| 3,953,871 | 4/1976 | Borchard et al. ....... 354/254 X |
| 4,315,678 | 2/1982 | Tsunefuji ................ 354/459 |

FOREIGN PATENT DOCUMENTS 71132 5/1982 Japan .
52242 3/1984 Japan .

Primary Examiner—L. T. Hix
Assistant Examiner—D. Rutledge
Attorney, Agent, or Firm—Michael N. Meller

[57] ABSTRACT

An apparatus for controlling the exposure for successively exposing or printing the same pattern in the different areas on a photosensitive surface of a photosensitive substrate such as a wafer or a photographic mask. The intensity of the light projected onto the photosensitive surface from a light source through a shutter is detected in response to the full opening of the shutter. The required exposure time is computed in accordance with the detection result and a desired exposure and the closing operation of the shutter is started when there is a special relation between the measured shutter time count and the computed result. To prevent any waste of the light source, the light source performs its light emitting operation such that alternate relatively high-intensity emission and relatively low-intensity emission are periodically repeated and the average input power to the light source during the interval is maintained at a predetermined value.

21 Claims, 20 Drawing Figures

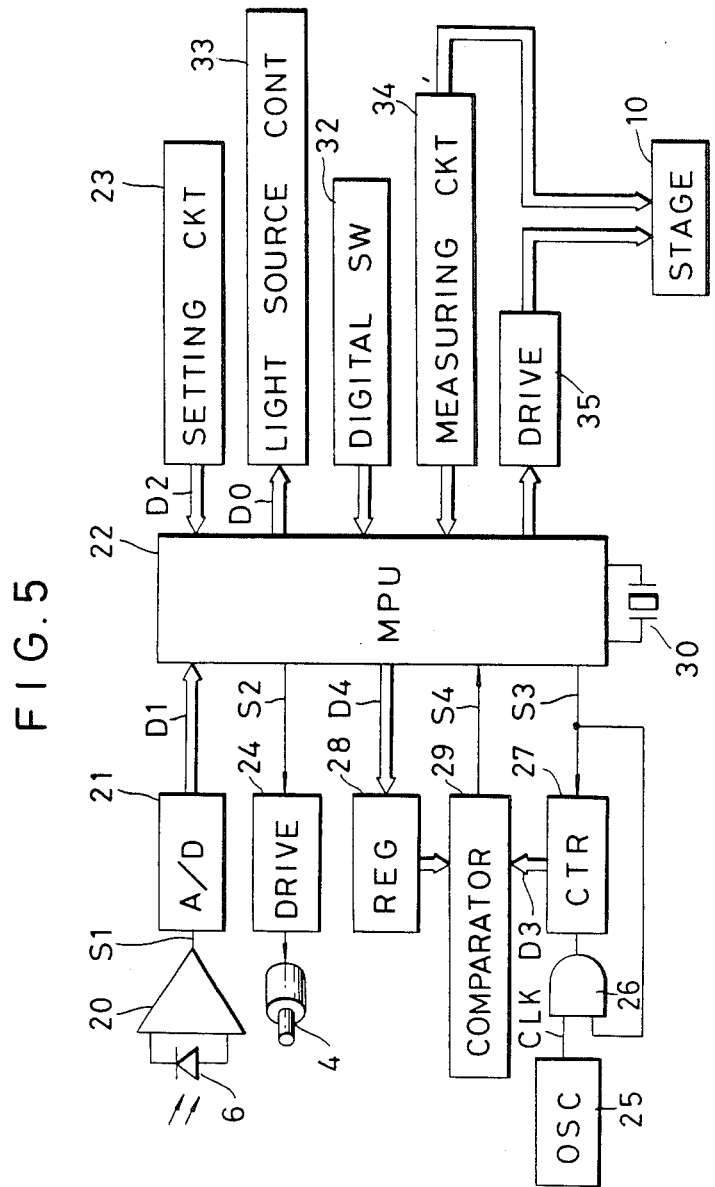
F I G. 5

FIG.10
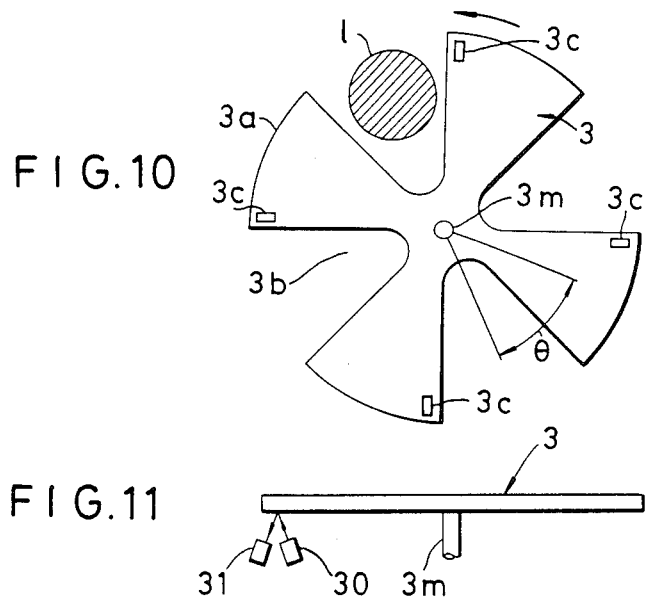
FIG.11
FIG.12
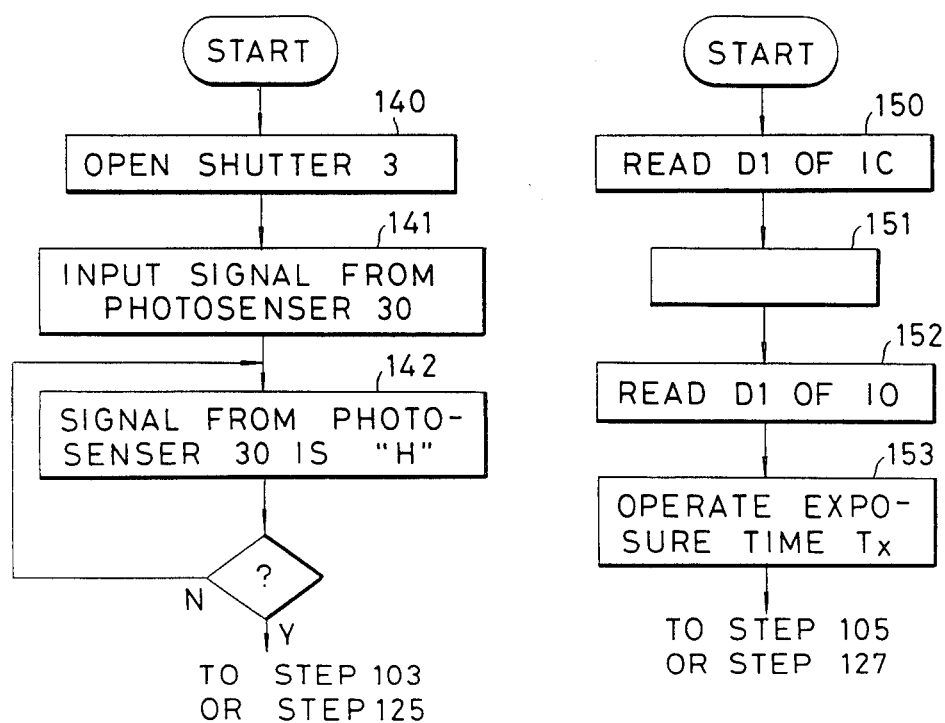
FIG.13

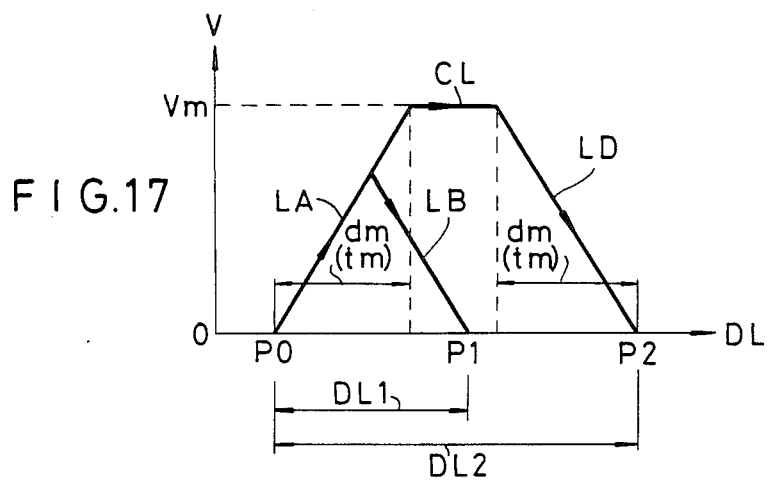
FIG. 17
FIG. 18
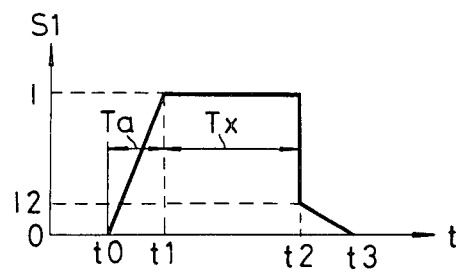
FIG. 20

EXPOSURE METHOD AND APPARATUS FOR SEMICONDUCTOR FABRICATION EQUIPMENT

This application is a continuation of application Ser. No. 688,599, filed Jan. 3, 1985, now abandoned.

BACKGROUND OF THE INVENTION

1. Field of the Invention

The present invention relates to exposure method and apparatus for printing the desired pattern on a photosensitive substrate such as a wafer or a photographic mask and more particularly to an exposure method and apparatus designed to control the amount of light for exposure.

2. Description of the Prior Art

Recently, in the fabrication of semiconductor devices, particularly ICs, there has been a demand for increasingly fine circuit patterns and also a highly accurate exposure control has been required for apparatus which print patterns having linewidths of 1 $\mu$m or less on wafers, that is, so-called exposure apparatus.

With exposure apparatus of this type which projects the images of a circuit pattern formed on a glass substrate such as a reticle or photographic mask onto a substrate to be exposed, e.g., a wafer or other photographic mask, generally it is desirable to always project a constant amount of exposure light onto the light-sensitive material (photoresist) applied to the wafer or the photographic mask.

SUMMARY OF THE INVENTION

It is a first object of this invention to provide an exposure method and apparatus for semiconductor device manufacturing purposes which always maintain constant the amount of exposure light projected onto a substrate, such as a wafer or a photographic mask, during the successive projection of images of the same circuit pattern on the substrate to be exposed.

It is a second object of the invention to provide an exposure method and apparatus which prevent waste of a light source used for the exposure of substrates.

In accordance with one embodiment of the invention, a control apparatus for accomplishing the primary object is constructed to project the light from a light source to a photosensitive substrate through a shutter to expose the photosensitive substrate, detect the intensity of the light from the light source in response to the full opening of the shutter, calculate a proper exposure time in accordance with a desired value corresponding to a proper exposure and the value of the detected light intensity, measure the exposure time by the shutter and start the closing operation of the shutter when a predetermined relation is attained between the measured exposure time and the calculated exposure time.

In accordance with another embodiment of the invention, a control apparatus for accomplishing the second object is constructed to cause a light source to perform its light emitting operation by periodically repeating an emission at a first light intensity and an emission at a second light intensity lower than the first light intensity and to maintain the average input power to the light source during the light emitting operation at a predetermined value.

In accordance with a preferred embodiment of the invention, in addition to the above-mentioned constructions, the average input power to the light source during the light emitting operation is maintained at the rated input power value of the light source.

In accordance with still another embodiment of the invention, a control apparatus for accomplishing the second object is constructed to cause a light source to perform its light emitting operation by periodically repeating an emission at a first light intensity, an emission at a second light intensity lower than the first light intensity and an emission at a third light intensity lower than the second light intensity and to maintain the average input power to the light source during the light emitting operation at a predetermined value.

In accordance with another preferred embodiment of the invention, in addition to the above-mentioned construction, the power supplied to the light source during the emission at the second light intensity is controlled at a predetermined value.

BRIEF DESCRIPTION OF THE DRAWINGS

FIG. 5 is a circuit block diagram of the exposure apparatus according to the invention.

FIG. 10 is a plan view of a shutter.

FIG. 11 is a side view of the shutter of FIG. 10.

FIG. 12 is a flow chart for explaining the operation of the apparatus employing the shutter of FIGS. 10 and 11.

FIG. 13 is a flow chart which is an improvement over the flow charts of FIGS. 6 and 9.

FIG. 17 is a speed-distance diagram for the stepping movement of a stage.

FIG. 18 is a diagram showing a variation pattern of the input power to a lamp during the exposure operation.

FIG. 20 is a diagram showing the exposure characteristics of a wafer.

DETAILED DESCRIPTION OF THE PREFERRED EMBODIMENTS

Figure 1:
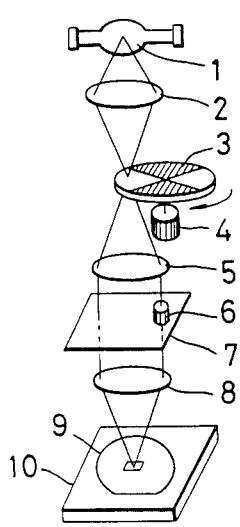
FIG. 1 is a schematic diagram showing the construction of an exposure apparatus according to the invention.

The principle of the present invention will now be described with reference to FIGS. 1-4. In FIG. 1, there is illustrated a projection-type exposure apparatus in which the light from an exposure light source, e.g., a mercury-vapor lamp 1, is concentrated by a condensing lens 2 and then directed to a wafer 9 (or a photographic mask) through a shutter 3 and through an optical element 5 including a condenser lens, an optical integrator or the like and a projection lens 8. A stage 10 moves the wafer 9 over a two-dimensional plane perpendicular to the optical axis of the optical system.

Figure 2:
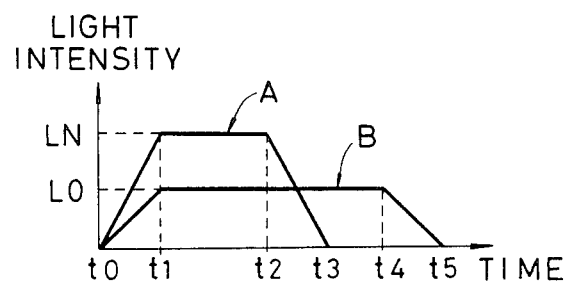
FIG. 2 is a characteristic diagram showing the light intensity characteristics obtained with a photosensitive substrate.

The shutter 3 is, for example, divided into four parts to provide alternate light blocking and transmitting portions and it is operated by a rotary drive unit, e.g., a pulse motor 4, to function as a rotary shutter. A glass substrate 7 (reticle or photographic mask) containing a circuit pattern is arranged between the condenser lens 5 and the projection lens 8 and the pattern on the glass substrate 7 is focussed onto the wafer 9. On the other hand, a photoelectric sensor 6 includes a photoelectric conversion element for measuring the light intensity of the light source and it measures the light passed through the shutter 3 and uses its output for exposure controlling purposes. With this apparatus, the opening and closing operation times of the shutter are as long as several milliseconds to several tens milliseconds due to its structure. FIG. 2 shows the variations of the light intensity with the exposure operation (the values detected by the sensor 6 or the values measured on the wafer 9). In FIG. 2, the abscissa represents the exposure time and the ordinate represents the light intensity. Trapezoidal polygonal lines A and B indicate the variation due to the deterioration of the light source lamp. The polygonal line A is obtained when the lamp is new and the light intensity is high and the polygonal line B is obtained when the lamp is deteriorated and the light intensity is low. Note that $L_N$ and $L_O$ represent the upper bases of the trapezoids, that is, the light intensities at the full opening of the shutter. These trapezoidal light intensity characteristics are provided due to the opening and closing times of the shutter. In other words, these characteristics are each provided by the time required for a ¼ rotation from a condition where the light is blocked by its light blocking portion to a condition where the light is transmitted completely (the shutter opening operation time) in a time interval $t_0$ to $t_1$ in FIG. 2. Note that $t_0$ represents the time at which the shutter 3 starts rotating. Then, after the expiration of the time interval $t_0$ to $t_1$, the shutter 3 transmits the light completely (this condition is hereinafter referred to as a full-open shutter) and thus the light intensity is stabilized at $L_N$ or $L_O$. Then, after the proper exposure time or at a time $t_2$ or $t_4$ the shutter 3 makes another ¼ rotation and the light is blocked by its light blocking portion. The light is completely blocked at a time $t_3$ or $t_5$. It is to be noted that due to its structure, the opening operation time and the closing operation time of the shutter are substantially the same so that the intervals $t_2$ to $t_3$ and $t_4$ to $t_5$ are equal to each other and also they are substantially equal to the interval $t_0$ to $t_1$.

Figure 3:
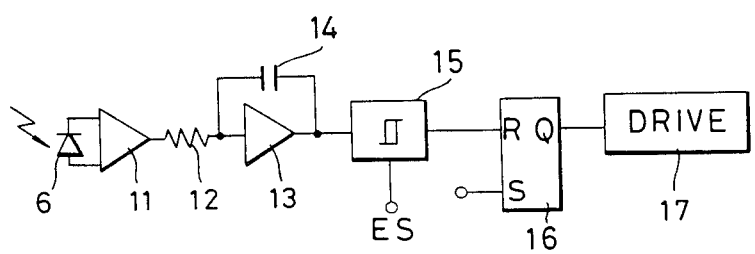
FIG. 3 is a circuit block diagram useful for explaining the principle of the invention.
Figure 4:
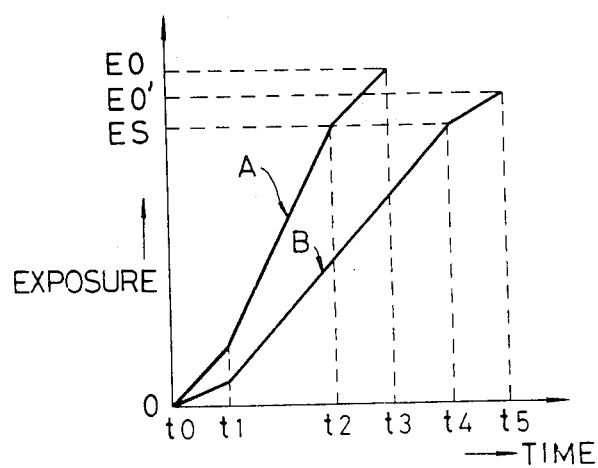
FIG. 4 is a characteristic diagram showing the exposure characteristics obtained with the control system of FIG. 3.

Referring to FIG. 3, the photoelectric output from the photoelectric sensor 6 is amplified by an amplifier 11 and then applied to an integrator including a resistor 12, a capacitor 14 and an amplifier 13. The integrator generates an output indicative of a value proportional to the exposure or a so-called integrated light quantity value. This output of the integrator is compared with a predetermined desired value (reference value) $E_s$ corresponding to the proper exposure by a comparator 15. On the other hand, a flip-flop circuit 16 is set at the starting time of each exposure operation and the pulse motor 4 is operated by a shutter drive circuit 17, thereby opening the shutter 3. After the shutter 3 has been opened, when the integrated light quantity value reaches the reference voltage $E_s$ as mentioned previously, the output of the comparator 15 is inverted and the flip-flop circuit 16 is reset. In response to this resetting, the drive circuit 17 rotates the motor 4 further and the shutter 3 is shut. In this way, the shutter 3 is controlled so that the integrated light quantity value is maintained at the constant value irrespective of the brightness of the lamp. The resulting exposures are shown by the graph of FIG. 4. In the graph of FIG. 4, the abscissa represents the same time base as in FIG. 2 and the ordinate represents the exposure or the integrated light quantity value. The interval from the exposure starting time $t_0$ to the time $t_1$ is the shutter opening operation time as shown in FIG. 2 and the exposure is increased gradually. The interval from the time $t_1$ to the time $t_2$ or $t_4$ is the full-open shutter period. It is to be noted that the exposure curves A and B respectively correspond to cases where the light intensity of the light source is high and where the light intensity is low as the cases shown in FIG. 2. When the exposure A or B attains the desired value $E_s$, the shutter shutting operation is started. However, the exposure is continued even during the interval $t_2$ to $t_3$ or $t_4$ to $t_5$ until the shutter is closed completely and consequently the total exposure becomes $E_0$, or $E_{0'}$ thus exceeding the predetermined desired value E (by an amount $E_0-E_s$ or $E_{0'}-E_s$).

If the light intensity of the light source is always constant, the total exposure can be determined by estimating the excess exposure. In fact, however, the brightness of the light source varies considerably with the deterioration of the lamp. Thus, as shown in FIG. 4, the excess exposure is varied even if the interval $t_2$ to $t_3$ is equal to the interval $t_4$ to $t_5$. This variation ($E_0-E_{0'}$) of the excess exposure can be ignored if the light intensity of the light source is low and the exposure time is long enough. However, where the light intensity of the light source is high and the ratio of the exposure during the shutter shutting operation time to the total exposure is large, the variation of the total exposure due to the variation ($E_0-E_{0'}$) gives rise to an important problem.

The embodiment of the invention will now be described in greater detail with reference to the circuit block diagram of FIG. 5. The photoelectric sensor 6 is arranged as shown in FIG. 1 and it generates a photoelectric signal corresponding to the intensity of the light transmitted through the shutter 3. The photoelectric signal is amplified by a given amount by an amplifier 20. The amplified photoelectric signal $S_1$ is converted to a digital value $D_1$ by an analog-to-digital converter 21 (hereinafter referred as an ADC). The ADC 21 successively performs its A/D conversion in response to changes in the magnitude of the photoelectric signal $S_1$. The digital value $D_1$ is applied to a microprocessor unit 22 (hereinafter referred to as an MPU) which collectively controls the apparatus on the whole. The MPU 22 includes a computing section, memory circuits for storing programs and data and an interface circuit for input and output operations on various information between it and external units so as to control the sequence of operations of the apparatus and perform computational operations on the various information. A setting circuit 23 sets a digital value $D_2$ for providing a proper exposure (the unit is mJ/cm, for example) for the wafer 9 and its value can be set arbitrarily as a desired value in accordance with the sensitivity of the light-sensitive coating and its thickness. A shutter drive control circuit 24 is responsive to a signal S₂ from the MPU 22 to generate drive pulses for rotating the pulse motor 4 a predetermined angle (e.g., 90 degrees).

Then, the time base for the exposure time is produced by an oscillator 25 (hereinafter referred to as OSC). The OSC 25 comprises, for example, a crystal oscillator circuit and generates clock signals CLK of a predetermined frequency. A gate circuit 26 receives the clock signals CLK and a signal S₃ from the MPU 22 so that the clock signals CLK are applied to a counter 27 when the signal S₃ goes to a logical value "H". The counter 27 (CTR) counts up the clock signals CLK passed through the gate circuit 26 when the signal S₃ is at the logical value "H" and sets its counted content to zero when the signal S₃ goes to a logical value "L". A register 28 temporarily stores a digital value D₄ corresponding to the exposure time calculated by the MPU 22, e.g., the open time of the shutter 3 corresponding to the interval t₀ to t₂ of the polygonal line A of FIG. 2 or the full-open period corresponding to the interval t₁ to t₂ of the polygonal line A of FIG. 2. A comparator 29 compares the count D₃ of the counter 27 and the digital value D₄ set in the register 28 and a coincidence signal S₄ is applied to the MPU 22 when the two values become equal to each other or D₃>D₄. A crystal oscillator 30 applies actuating clock signals of a predetermined frequency to the MPU 22 for controlling its internal operations. The actuating clock signals determine the cycle times and the operation times of the MPU 22. Also, the data corresponding to the opening (or closing) operation time of the shutter 3 is preliminarily stored in the memory circuit of the MPU 22. A digital switch 32 sets the amount of movement of the stage 10. A light source control circuit 33 controls the power supplied to the mercury-vapor lamp 1. A driving device 35 moves the stage 10 two-dimensionally, and a measuring circuit 34 detects and applies the two-dimensional position of the stage 10 to the MPU 22.

Next, the operation of this embodiment will be described with reference to the flow chart of FIG. 6 and the timing chart of FIG. 7.

Firstly, at a step 100, the MPU 22 starts the counting operation of the counter 27 and also the counting operation by the internal counter of the MPU 22 is started. The internal counter comprises, for example, a general-purpose register and a value $T_a$ corresponding to the opening operation time of the shutter 3 is preliminarily read from the memory circuit and set in the register. At the step 100, the MPU 22 changes the signal S₃ from the logical value "L" to the logical value "H". The MPU 22 starts to successively decrement by one at a time the value $T_a$ set in the internal counter in response to signals generated by, for example, dividing the frequency of the actuating clock signals from the crystal oscillator 30.

After the step 100 has been completed, at the next step 101, the MPU 22 generates a signal S₂ and starts the opening operation of the shutter 3. At this time, as shown by the timing chart of FIG. 7, the shutter drive circuit 24 applies a predetermined number of drive pulses to the pulse motor 4. This causes the shutter 3 to start rotating. This starting takes place at a time t₀ as in the case of FIG. 2.

Then, at a step 102, the MPU 22 determines whether the count of the internal counter has been reduced to zero, that is, whether the opening operation time $T_a$ has expired since the time t₀. Then, at the instant that the time Ta has expired or the shutter 3 has been opened fully at a time t₁ at the step 102, the MPU 22 proceeds to the next step 103 where the digital value D₁ of the ADC 21 is read in. When the shutter 3 has been opened fully, the photoelectric sensor 6 receives the light from the mercury-vapor lamp 1 maximally. The resulting light intensity assumes a value I of the photoelectric signal S₁ as shown in FIG. 7 and the digital value D₁ corresponds to the value I.

Then, the MPU 22 computes an exposure time $T_x$ at a step 104. This exposure time Tx represents the interval of time between the time t₀ at which the opening operation of the shutter 3 is started and a time t₂ at which the shutter 3 starts its closing operation. At the step 104, the MPU 22 also receives a digital value D₂ or the desired value from the setting circuit 23. The digital value D₂ corresponds to the proper exposure and it is given in terms of the product of the light intensity of the mercury-vapor lamp 1 (or the intensity of the light incident on the wafer 9 when the shutter 3 is opened fully) and the time. Since the light intensity has been read as the digital value D₁, the exposure time $T_x$ can be computed from the following equation (1)

$$T_x = k \cdot \frac{D_2}{D_1} \tag{1}$$

where k is a constant.

Then, at a step 105, the MPU 22 sets a digital value D₄ corresponding to the computed exposure time $T_x$ in the register 28. During the period of steps 102–105, the counter 27 continues to count the clock signals CLK. Then, the MPU 22 receives a coincidence signal S₄ at a step 106 and determines whether the coincidence signal S₄ has the logical value "H" or whether the digital value D₃ of the counter 23 is greater than the digital value D₄ of the register 28 at a step 107. If the coincidence signal S₄ has the logical value "L", the steps 106 and 107 are performed repeatedly. During the interval, the digital value D₃ of the counter 27 continues to increase so that at the time t₂ at which the exposure time $T_x$ expires, the MPU 22 detects the coincidence signal S₄ having the logical value "H" and proceeds to the next step 108.

At the step 108, the MPU 22 applies a signal S₂ to the shutter drive control circuit 24. As a result, the pulse motor 4 is operated by the given number of drive pulses and the shutter 3 starts its closing operation.

Figure 7:
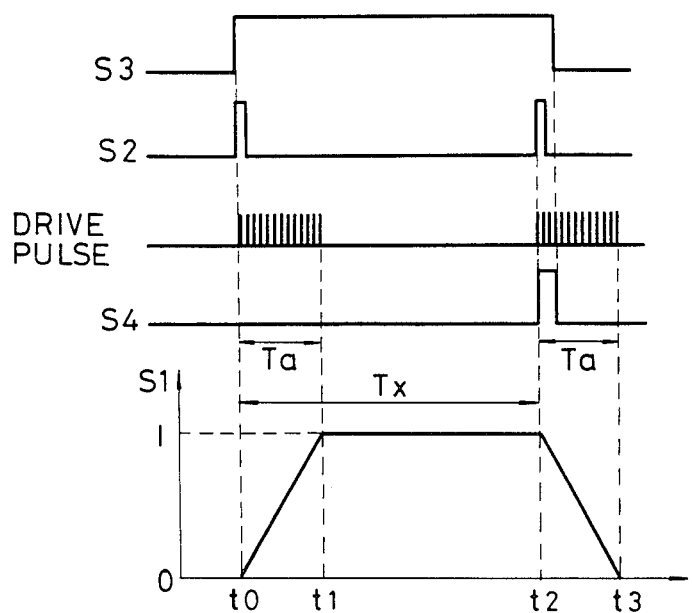
FIG. 7 is a timing chart of the signals in the circuit of FIG. 5.

Then, at a step 109, the MPU 22 changes the signal S₃ from the logical value "H" to the logical value "L" to close the gate circuit 26 and also stops the counting operation of the counter 27 to clear its counted content as shown in FIG. 7. Simultaneously, the MPU 22 stops the counting operation of the internal counter. Then, upon reaching a time t₃ at which the shutter drive circuit 24 completes the generation of the given number of drive pulses, the shutter 3 completes its shutting operation and thus the exposure operation of the wafer 9 is completed. In this case, the time $T_x$ corresponds to the interval t₀ to t₂. The reason for this is that the exposure obtained by the shutter control corresponds to the integrated value of the signal S₁ during the interval between the times t₀ and t₃ in FIG. 7 and it is considered that this integrated value is equal to the product of the time interval t₀ to t₂ and the light intensity I. Also, this is based on a concept that the integrated value of the signal S₁ during the interval t₀ to t₁ is equal to that in the interval t₂ to t₃.

While, in the exposure apparatus of the stepand-repeat type, the operation of moving the stage having the wafer 9 mounted thereon a predetermined pitch and exposing a different area of the wafer 9 is performed repeatedly, this has no direct bearing on the present invention and will not be described. Also, while in accordance with the embodiment the digital value $D_3$ of the counter 27 is increased from the opening starting time of the shutter 3, if, in this case, the value set in the register 28 is so small that it has no bearing on the exposure time $T_x$ to be obtained at the step 104, the coincidence signal $S_4$ is changed to the logical value "H" during the opening operation (the interval between the times $t_0$ and $t_1$) of the shutter 3. However, the MPU 22 receives the coincidence signal $S_4$ after the digital value $D_4$ corresponding to the computed exposure time $T_x$ has been set in the register 28 and therefore the shutter 3 is controlled without any erroneous operation until the proper exposure is obtained.

Further, while, in the above embodiment, the exposure time $T_x$ is determined as the interval of time between the beginning of opening and the beginning of closing of the shutter 3, it may be determined as the full-open period (the interval between the times $t_1$ and $t_2$) of the shutter 3. More specifically, in the flow chart of FIG. 6, the counting operation of the counter 27 is started between the steps 102 and 103 instead of at the step 100 and the signal $S_3$ for the counting of the counter 27 is changed to the logical value "H" when the shutter 3 is opened fully. Then the computation of the exposure time $T_x$ at the step 104 is performed in accordance with the following equation (2) in place of equation (1), thereby computing as $T_x$ the full-open period of the shutter 3 which is shorter by the opening (closing) operation time $t_a$:

$$T_x = k \frac{D_2}{D_1} - T_a \quad (2)$$

In this way, all the same effects can be obtained.

Figure 8:
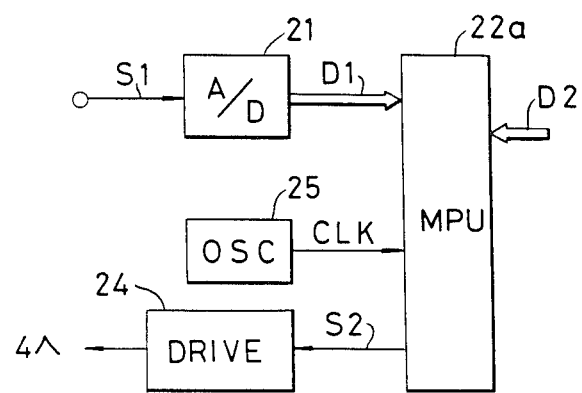
FIG. 8 is a circuit block diagram showing a modification of the circuit shown in FIG. 5.

FIG. 8 shows a modification of the circuit shown in FIG. 5 in which the functions of the gate circuit 26, the counter 27, the register 28 and the comparator 29 for detecting the exposure time $T_x$ in accordance with the clock signals CLK from the OSC 25 are realized by the program of an MPU 22a. Thus, this modification is simple as compared with the circuit construction shown in FIG. 5 and it comprises the ADC 21 for converting the photoelectric signal $S_1$ to a digital value $D_1$, the OSC 25 for generating the clock signals CLK, and the shutter drive circuit 24 responsive to the signal $S_2$ from the MPU 22a to operate the pulse motor 4. Of course, the setting circuit 23 and the crystal oscillator 30 are also provided as in the case of FIG. 5.

The operation of this circuit will now be described with reference to the flow chart of FIG. 9. However, the MPU 22a includes two counters $TM_1$ and $TM_2$ as its internal counters. Firstly, the MPU 22a sets a value corresponding to the opening operation time $T_a$ of the shutter 3 in the counter $TM_1$ at a step 120. At the next step 121, the MPU 22a generates a signal $S_2$ and starts the opening operation of the shutter 3. Then, at a step 122, the MPU 22a determines whether a clock pulse or clock signal CLK has been received, and if it has, whether the value of the counter $TM_1$ is zero or not is determined at the next step 123. If the value of the counter $TM_1$ is not zero, the MPU 22a proceeds to a step 124 where the value of the counter $TM_1$ is decremented by one and a return is made to the step 122. Thus, there is a time of waiting corresponding to the time $T_a$ which is determined by the execution time of the steps 122, 123 and 124. For instance, if the clock signal CLK or clock pulse is generated at intervals of 1 ms and the time $T_a$ is 40 ms, then the value set in the $TM_1$ at the step 120 is 40. In this way, when the clock signals CLK are counted so that the value of the counter $TM_1$ is reduced to zero or the shutter 3 is opened fully, the MPU 22a performs the next step 125. At the step 125, the MPU 22a reads the digital value $D_1$ corresponding to the magnitude of the photoelectric signal $S_1$ from the ADC 21. Then, at the next step 126, the MPU 22a reads the digital value $D_2$ from the setting circuit 23 and computes the proper exposure time $T_x$. Here, the full-open period of the shutter 3 is computed as the exposure time $T_x$ in accordance with the equation (2). The thus computed value is set in the counter $TM_2$ of the MPU 22a. Then, at a step 127, the MPU 22a determines whether one clock signal CLK or clock pulse has been received and if it has, it is determined whether the value of the counter $TM_2$ is zero at a step 128. If it is not, the value of the counter $TM_2$ is decremented by one at a step 129 and the processing is repeatedly performed from the step 127. Thus, when the value of the counter $TM_2$ is reduced to zero or when the exposure time $T_x$ (the full-open-period) expires, the MPU 22a generates a signal $S_2$ and starts the closing operation of the shutter 3 at a step 130.

It is to be noted that while the opening (closing) operation time $T_a$ of the shutter 3 and the exposure time $T_x$ are measured by the separate internal counters, a single internal counter may be used in common if the exposure time $T_x$ is the full-open period.

Figure 6:
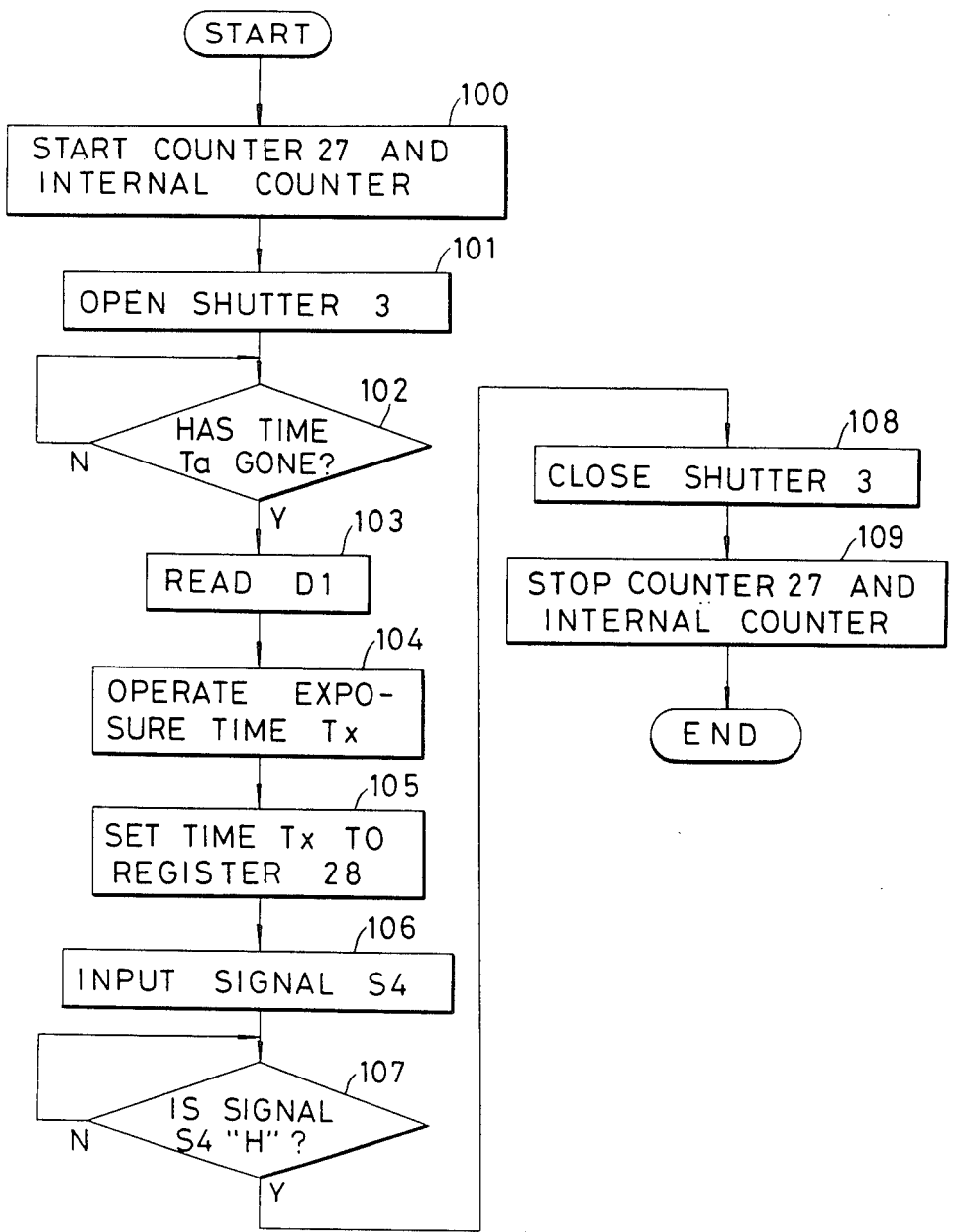
FIG. 6 is a flow chart for explaining the operation of the circuit of FIG. 5.
Figure 9:
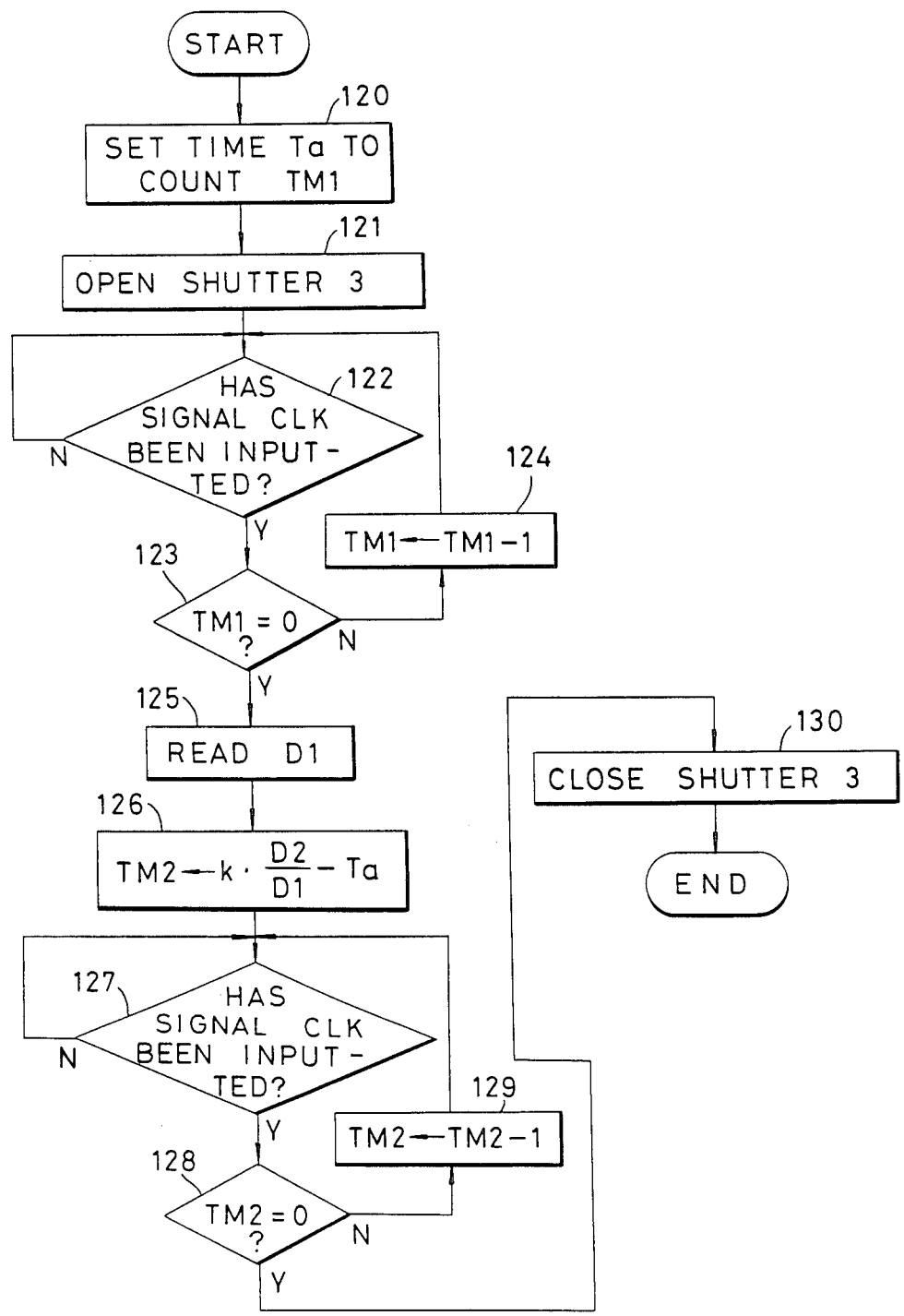
FIG. 9 is a flow chart for explaining the operation of the circuit of FIG. 8.

Next, the relation between the shutter 3 and the MPU will be described with reference to FIGS. 10 and 11. FIG. 10 is a plan view of the shutter 3 in the form of a shutter including blades 3a for blocking the hatched concentrated beam 1 from the mercury-vapor lamp 1 and slots 3b for passing the beam 1. The blades 3a and the slots 3b are arranged alternately at intervals of 45 degrees. The shutter 3 is rotated counterclockwise in angular steps of 45° to effect its opening and closing operations. Note that a shaft 3m directly connected to the pulse motor 4 is firmly fitted in the center of the shutter 3. While the shutter 3 is coated with black paint all over its surface, a light reflector 3c is provided in a portion of each blade 3a such that the light reflectors 3c are arranged at equiangular intervals. The illuminating light from a projector 30 is projected selectively onto the light reflectors 3c and the reflected light from the light reflector 3c is received by a photosensor 31. The projector 30 and the photosensor 31 form a reflection-type photo coupler. This photo coupler is arranged, for example, so as to receive the light from the light reflector 3c at a position where the shutter 3 is opened fully and the light beam 1 is passed without being blocked by the blade 3a as shown in FIG. 10.

Where such a photo coupler is provided, the circuit of FIG. 5 or 8 is constructed so that the MPU receives the output signal of the photosensor 31 and the steps 100 to 102 in the flow chart of FIG. 6 or the steps 120 to 123 in the flow chart of FIG. 9 are replaced by steps 140 to 142 in the flow chart of FIG. 12.

The opening operation of the shutter 3 is started first at the shutter opening step 140 and then the output signal of the photosensor 30 is read at the step 141.

Then, whether the signal has the logical value "H" indicative of the reception of the reflected light from the light reflector 3c is determined at the step 142 so that if it does (the full-open condition), a transfer is made to the step 103 shown in FIG. 6 or the step 125 shown in FIG. 9 and the same operation is performed. However, upon the opening of the shutter 3 the internal counter of the MPU 22 starts counting the clock signals CLK so that in the case of FIG. 9, at the instant that the output signal of the photosensor 31 attains the logical value "H" at the step 142 the counting is stopped and the opening operation time $T_a$ of the shutter 3 is detected.

With this construction, the digital value $D_1$ read into the MPU accurately corresponds to the light intensity in the full-open shutter condition.

Also, while the MPU reads the digital value $D_1$, of the ADC 21 upon the full opening of the shutter or just after the full opening, it is possible to effect the reading a plurality of times in a short period of time and average the obtained plurality of digital values $D_1$ thereby using the result as the desired light intensity value. By so doing, it is possible to more accurately detect the light intensity value against variations in the light intensity of the mercury-vapor lamp 1 due to the ripple of the power source, noise and the like.

Then, where the light intensity is detected by the photoelectric sensor 6, the amplifier 20 has a high amplification factor and therefore there is the danger of the offset voltage being superposed on the photoelectric signal $S_1$. While it is not impossible to completely eliminate the offset voltage from the circuit point of view, its elimination is extremely difficult in consideration of the temperature variations. Thus, an example of overcoming this difficulty will be described briefly with reference to the flow chart of FIG. 13.

Firstly, at a step 150, the magnitude (voltage) of the photoelectric signal $S_1$ in the closed condition of the shutter 3 is read as a value $I_c$ from the digital value $D_1$ of the ADC 21 by the MPU. The value $I_c$ corresponds to the magnitude of the offset voltage and it is stored in the internal memory circuit of the MPU. At the next step 151, all the same operations as the steps 100 to 102 of FIG. 6, the steps 120 to 123 of FIG. 9 or the steps 140 to 142 of FIG. 12 are performed and a transfer is made to a step 152 at the expiration of the operation time $T_a$ after the starting of the opening operation of the shutter 3. At the step 152, the MPU 22 again reads the digital value $D_1$ of the ADC 21 as a value $I_0$. The value $I_0$ corresponds to the sum of the light intensity value and the offset voltage.

Then, at a step 153 for computing an exposure time $T_x$, the MPU 22 computes the exposure time $T_x$ from one or the other of the following equations (3) and (4) in correspondence with the previously mentioned equation (1) or (2).

$$T_x = k \cdot \frac{D_2}{I_0 - I_c} \quad (3)$$

$$T_x = k \cdot \frac{D_2}{I_0 - I_c} - T_a \quad (4)$$

As will be seen from equations (3) and (4), by using the difference between the value $I_0$ in the full-open condition of the shutter 3 and the value $I_c$ in the closed condition of the shutter 3 as the light intensity value, it is possible to cancel the offset voltage generated in the circuit and obtain the true light intensity value. Then, at a step 154, the MPU 22 performs the same operations as the steps 105 to 109 of FIG. 6 or the steps 127 to 130 of FIG. 9, thus closing the shutter 3 after the expiration of the exposure time $T_x$.

Where the light intensity of the mercury-vapor lamp 1 practically remains unchanged during the exposure of a single wafer or mask, it is possible to obtain the exposure time $T_x$ by fully opening the shutter 3 and measuring the light intensity before starting the exposure of the wafer so that during the actual exposure, the shutter 3 is controlled in accordance with the obtained exposure time and the wafer is exposed successively.

Also, in the case of an apparatus so constructed that the light intensity of the lamp 1 in its fresh condition is determined in terms of the illuminance (the unit is $mW/cm^2$) on the wafer 9 and the exposure time is set in accordance with the illuminance, it is only necessary to add a step for calculating the sum of the set exposure time and the predetermined illuminance (light intensity) as the desired exposure (the digital value $D_2$). In this case, the set exposure time is simple used for determining the desired exposure and the actual exposure time $T_x$ is varied in accordance with the light intensity read by the ADC 21.

Figure 14:
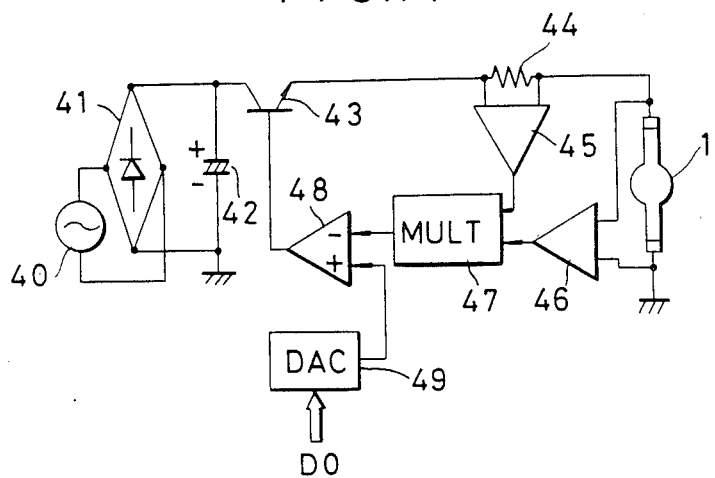
FIG. 14 is a block diagram showing an embodiment of a light source control circuit.

FIG. 14 is a circuit block diagram showing a specific embodiment of the light source control circuit 33 of FIG. 5 in which the current from a commercial ac power source 40 is rectified by a rectifier 41, smoothed out by a capacitor 42 and converted to a dc voltage. The dc voltage smoothed by the capacitor 42 is applied to one of the electrodes of the mercury-vapor lamp 1 through the collector-emitter circuit of a control transistor 43 and a bleeder resistor 44 and the other electrode is grounded.

The voltage drop across the ends of the bleeder resistor 44 is proportional to the magnitude of the current flowing to the mercury-vapor lamp 1 and this voltage drop is applied to one input terminal of a multiplier 47 through an amplifier 45. The voltage across the mercury vapor lamp 1 is applied to the other input terminal of the multiplier 47 through an amplifier 46 so that the multiplier 47 generates an output corresponding to the product of the output voltage of the amplifier 45 and the output voltage of the amplifier 46 or the input power value of the mercury-vapor lamp 1. The output of the multiplier 47 is applied to one input terminal of a differential amplifier 48 and applied to the other input terminal of the differential amplifier 48 is a digital data $D_0$ which has been generated from the MPU 22 and converted to an analog value by a digital-to-analog converter 49 (hereinafter referred to as a DAC). The differential amplifier 48 detects the deviation between the two input signals. The deviation-indicative output of the differential amplifier 48 is applied to the base of the control transistor 43 and the collector current of the control transistor 43 is controlled by the deviation output. The current control loop of the transistor 43 including the differential amplifier 48 operates so as to always maintain the difference between the outputs of the multiplier 47 and the DAC 49 at zero and therefore the input power to the mercury-vapor lamp 1 is variable in accordance with the data $D_0$ from the MPU 22.

In this way, a feedback control system is incorporated for the power source of the mercury-vapor lamp 1 so that the power set by the data $D_0$ is supplied to the mercury-vapor lamp 1.

It is to be noted that up to the time of starting the exposure operation the MPU 22 applies the data $D_0$ corresponding to the rated input power $P_N$ of the lamp 1 to the DAC 49 and thus the lamp 1 is turned on by the rated input power of 500 W, for example.

Next, the light source control operation of the exposure apparatus shown in FIG. 5 will be described with reference to the flow charts of FIGS. 15 and 16.

Figure 15:
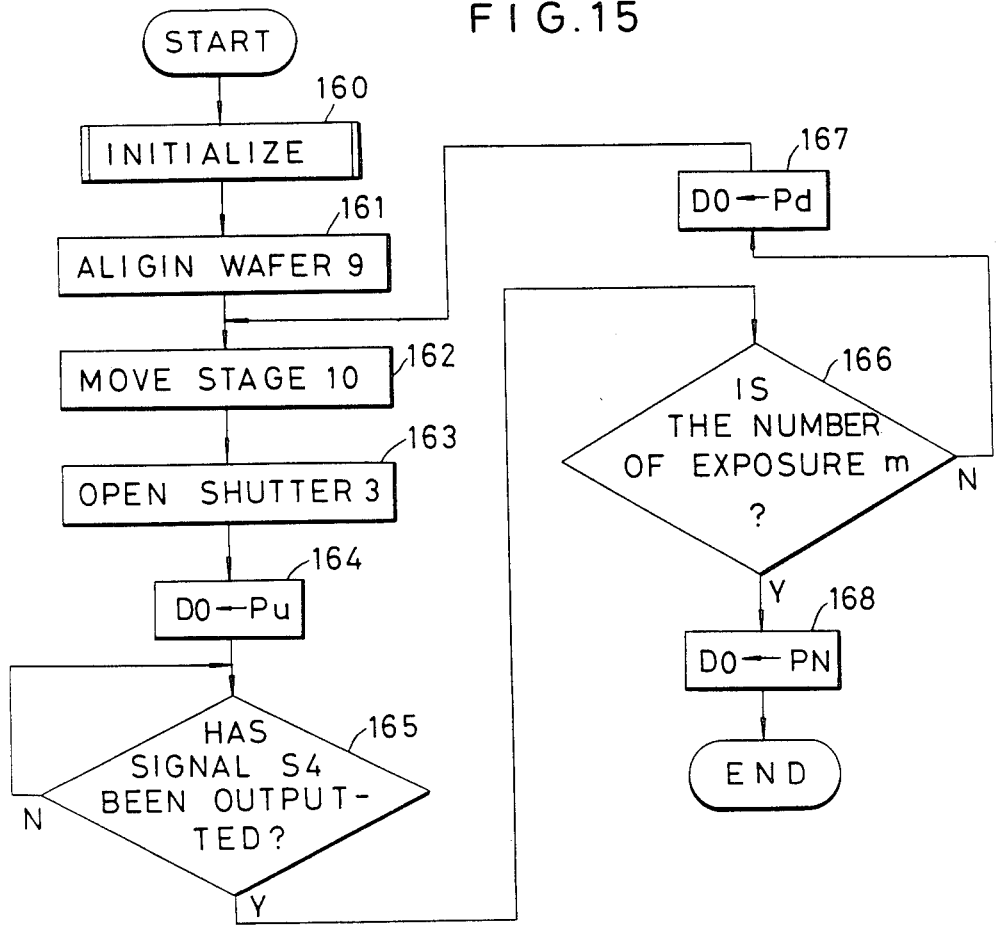
FIG. 15 is a flow chart showing an example of the light source control operation.

FIG. 15 shows a principal program flow for the light source control before performing the exposure operation of the wafer 9 and the first step 160 is for initializing purposes. The step 160 obtains an exposure time $t_e$ for the step-and-repeat type exposure operation, a stepping time $t_s$ of the stage 10 and a reduced power value $P_d$ of the light source power down, and the details of the step 160 will be described in detail with reference to the subroutine program flow of FIG. 16 as follows.

<Step 200>

A power-up proportion C indicative of an amount of increase in the input power to the lamp 1 or how the input power is to be increased over the rated input power is set as the first step of the initialization. For example, the proportion C has a value such that $0 \leq C \leq 1$ and the proportion C is selected C=1 for reducing the exposure time $t_e$, that is, a power-up of 100% over the rated input power is specified so that during the power-up period the input power to the lamp 1 is increased to two times the rated input power.

(Step 201)

A power-up input power value $P_u$ is obtained in accordance with the power-up proportion C set at the step 200 and the rated input power value $P_N$ of the lamp 1. In other words, this step performs the following calculation.

$$P_u = P_N(1+C)$$

(Step 202)

It is determined whether the power-up power $P_u$ obtained at the step 201 is smaller than the maximum allowable instantaneous input power $P_{um}$. If $P_u > P_{um}$, a transfer is made to a step 203. If $P_u \leq P_{um}$, the value of $P_u$ is set as such and a transfer is made to the next step 204.

(Step 203)

This step is performed when the decision of the step 202 results in $P_u > P_{um}$ and in this case the value of $P_{um}$ is set as $P_u$ instead of the value of $P_u$ computed at the step 201, thereby making a transfer to the next step 204.

(Step 204)

Simultaneously with the generation of the signal $S_2$ at the step 101 of FIG. 6 the content of the data $D_0$ is changed from the rated input power value $P_N$ to the power-up power value $P_u$ and the light intensity of the lamp 1 is increased through the control circuit 33.

(Step 205)

After the steps 102–105 of FIG. 6 have been completed, a transfer is made to the step 205. At this step, the generation of a signal $S_4$ is monitored so that the generation of the signal $S_4$ from the comparator 29 is detected by the MPU 22. This operation corresponds to the steps 106 and 107 of FIG. 6.

(Step 206)

This step stops the counting operation of the internal counter of the MPU 22 and the counter 27 at the same time with the arrival of the signal $S_4$ from the comparator 29. At this time, the shutter drive circuit 25 is operated in response to the signal $S_4$ and thus the shutter 3 is closed. This step corresponds to the steps 108 and 109 of FIG. 6.

(Step 207)

At the same time that the signal $S_4$ arrives, the MPU 22 restores the content of the data $D_0$ from $P_u$ to $P_N$.

As the result of the above-mentioned operations, the opening time of the shutter 3 required for ensuring the proper exposure for the wafer 9 to be exposed or the exposure time $t_e$ is measured.

(Step 208)

At this step, the MPU 22 reads the value set in the digital switch 32 or the amount of stage movement DL (the amount of stepping movement) from one exposure field to the next field on the wafer 9 in the step-and-repeat operation.

(Step 209)

This step and the following are performed to obtain the stepping time $t_s$ and the power-down power $P_d$ in accordance with the stepping movement DL and they will be described with reference to FIG. 17 as follows.

FIG. 17 shows the relation between the distance of movement and time of the stage 10 and the stage 10 is shown as adapted to be subjected to uniform acceleration control.

In FIG. 17, when the stage 10 is to be moved to a position $P_1$, which is separated by a distance $DL_1$ from a position $P_0$, the velocity is increased with a constant slope from the position $P_0$ in accordance with an acceleration characteristic LA (the acceleration a) and the velocity is decreased with a constant slope from a position separated by a distance $DL_{\frac{1}{2}}$ from the position $P_0$ in accordance with a deceleration characteristic LB (the acceleration -a), thereby reducing the velocity to $O_1$ or stopping the stage at the position $P_1$. Thus, it is necessary to obtain the stepping time $t_s$ for this case.

From the characteristics LA and LB it is apparent that the time required for the stage 10 to move from the position $P_0$ by the distance $DL_{\frac{1}{2}}$ is just one half the time required for moving from the position $P_0$ to the position $P_1$ and thus the following equation holds under the condition that the initial velocity of the stage 10 is zero:

$$DL_{\frac{1}{2}} = at^2/2 (t = \text{time})$$

Therefore $$t = \sqrt{DL_{\frac{1}{2}}}.$$

Consequently, the stepping time $t_s$ from the position $P_0$ to the position $P_1$ is given by $$t_s = 2\sqrt{DL/a} \qquad (5)$$

On the other hand, the acceleration characteristic LA does not increase infinitely and it is limited to a maximum velocity $V_m$. As a result, if the distance DL is increased to a distance $DL_2$, for example, the stage 10 is controlled in accordance with the acceleration characteristic LA, a constant velocity characteristic LC and the deceleration characteristic LD in this order.

Thus, where the stage 10 is to be moved to a position $P_2$ which is separated by the distance $DL_2$ from the position $P_0$, a distance $d_m$ moved during the acceleration characteristic LA and the deceleration characteristic LD, respectively, and the time $t_m$ required therefor are previously known as the inherent characteristic values of the stage 10 and therefore a steppng time $t_c$ during the constant velocity characteristic LC is obtained from the following equation $$t_c = (DL_2 - 2d_m)/V$$

Thus, the total stepping time $t_s$ is computed from the following equation $$t_s = 2t_m + (DL - 2d_m)/V \quad (6)$$

In this way, the step 209 determines whether the amount of movement $DL > 2\ d_m$ so that a transfer is made to stop 210 if $DL > 2\ d_m$ and a transfer is made to a step 211 is $DL \leq 2\ d_m$.

(Step 210)

If $DL > 2\ d_m$, the stepping time $t_s$ is obtained from equation (6).

(Step 211)

If $DL \leq 2\ d_m$, the stepping time $t_s$ is obtained from equation (5).

In accordance with the stepping time $t_s$ obtained at the step 210 or 211 and the exposure time $t_e$ measured up to the step 206, a power-down reduced power value $P_d$ is computed. In other words, if the exposure of a single wafer 9 is repeated m times, the power down is effected during the stepping period in the interval between the exosure timings and thus it takes place (m−1) times. The calculation of the power-down power value $P_d$ will now be described with reference to FIG. 18.

In FIG. 18, during a time $T_k$ from the beginning of the first exposure to the end of the last exposure of each wafer 9 an average power $P_A$ applied to the lamp 1 is given by the following equation $$P_A = \{m \cdot t_e \cdot P_u + (m-1) \cdot t_s \cdot P_d\}/T_k$$

If this average power $P_A$ is set equal to the rated input power $P_N$, then the power-down power $P_d$ is given by the following in accordance with the above equation $$P_d = \{P_N \cdot T_k - m \cdot t_e \cdot P_u\}/\{(m-1) \cdot t_s\}$$

Here, $T_k = m \cdot t_e + (m-1)t_s$ and therefore the following holds $$P_d = P_N - \{m \cdot t_e(P_u - P_N)/(m-1)t_s\} \quad (7)$$

For example, if, with $P_N = 500$ W and $P_u = 1000$ W, $t_e = 0.3$ sec and $t_s = 0.8$ sec are obtained and if m=50, then $P_d$ is calculated as $$P_d = 500 - 50 \times 0.3 \times (1000-500)/49 \times 0.8 \approx 309\ W$$

Note that if the value of m is large, equation (3) may be approximated as follows $$P_d = P_N - t_e(P_u - P_N)/t_s \quad (7a)$$

(Step 213)

This step determines whether the power-down power $P_d$ computed at the preceeding step is greater than the instantaneous minimum input power $P_{dm}$. If the input power is smaller than the value of $P_{dm}$, it is impossible to hold the lamp 1 in the operated condition and therefore a lamp turn-on operation must be performed for relighting purposes. Thus, at the step 213, a comparison is made between $P_d$ and $P_{dm}$ so that if $P_d \geq P_{dm}$, a return is made to the original program of FIG. 15 and the processing proceeds to a step 161. If $P_d < P_{dm}$, the processing proceeds to the step 161 through the next step 214.

(Step 214)

This step is performed when the step 213 determines that $P_d < P_{dm}$ and in this case it is set so that the value of $P_{dm}$ is used as $P_d$. In other words, the lower limit of the power-down power value is restricted by this step.

When the above-described subroutine of FIG. 6 or the initialize step 160 has been completed, a return is made to the flow of FIG. 15 and the exposure operation of the wafer 9 is initiated. In FIG. 15, the first step following the initialization is the step 161 for the alignment of the wafer 9.

(Step 161)

The wafer 9 is transferred onto the stage 10 and the wafer 9 is accurately aligned with the stage 10. With the operations following the alignment, the light source control operation is performed in accordance with a lamp input power pattern as shown in FIG. 18 in synchronism with the movement of the stage 10 for step-and-repeat exposure purposes. The following steps 162 et seq. are performed successively.

(Step 162)

By moving the stage 10 in a stepping manner, the projection position of a pattern image of a reticle is aligned with a proper position on the wafer 9.

(Step 163)

The MPU 22 generates a signal $S_2$ and opens the shutter 3.

(Step 164)

Simultaneously with the generation of the signal $S_2$ at the step 163, the data $D_0$ to be applied to the DAC 49 from the MPU 22 is changed to the content corresponding to the power-up power value $P_u$ and the input power of the lamp 1 operating on the rated power $P_N$ is added to the power-up power $P_u$.

(Step 165)

The arrival of a signal $S_4$ is monitored so that when the signal $S_4$ from the comparator 29 is applied to the MPU 22, a transfer is made to a step 166. In this case, the opening time of the shutter 3 is the exposure time $t_e$ which has already been set at the previously mentioned step 105.

(Step 166)

The number of exposure events of the wafer 9 is checked so that a transfer is made to a step 167 when the number is less than m and a transfer is made to a step 168 when the number equals m.

(Step 167)

If the step 166 detemines that the number of exposure events is less than m, the content of the data $D_0$ from the MPU 22 is changed to one corresponding to the power-down power value $P_d$ and the input power of the lamp 1 is reduced to $P_d$. Then, after the stepping time $t_s$, a return is made to the step 162 and the exposure is repeated.

(Step 168)

If the step 166 detects that the number of exposure events equal m, the input power of the lamp 1 is restored to the rated value $P_N$ and the exposure operation of the wafer is completed.

The light source control operation during the exposure of the wafer has been completed and the continued exposure of the next wafer can be effected by simply repeating the same steps starting at the step 161. In FIG. 18, the time $T_k$ represents the time required for the exposure of one wafer and the time $T_c$ is time required for removing the wafer after the completion of its exposure and transferring and aligning the next wafer. Also, for example, the photoresist itself or its thickness varies as when a wafer of a different kind is used or when the exposure time is varied, the initialization is effected at the step 160.

Figure 16:
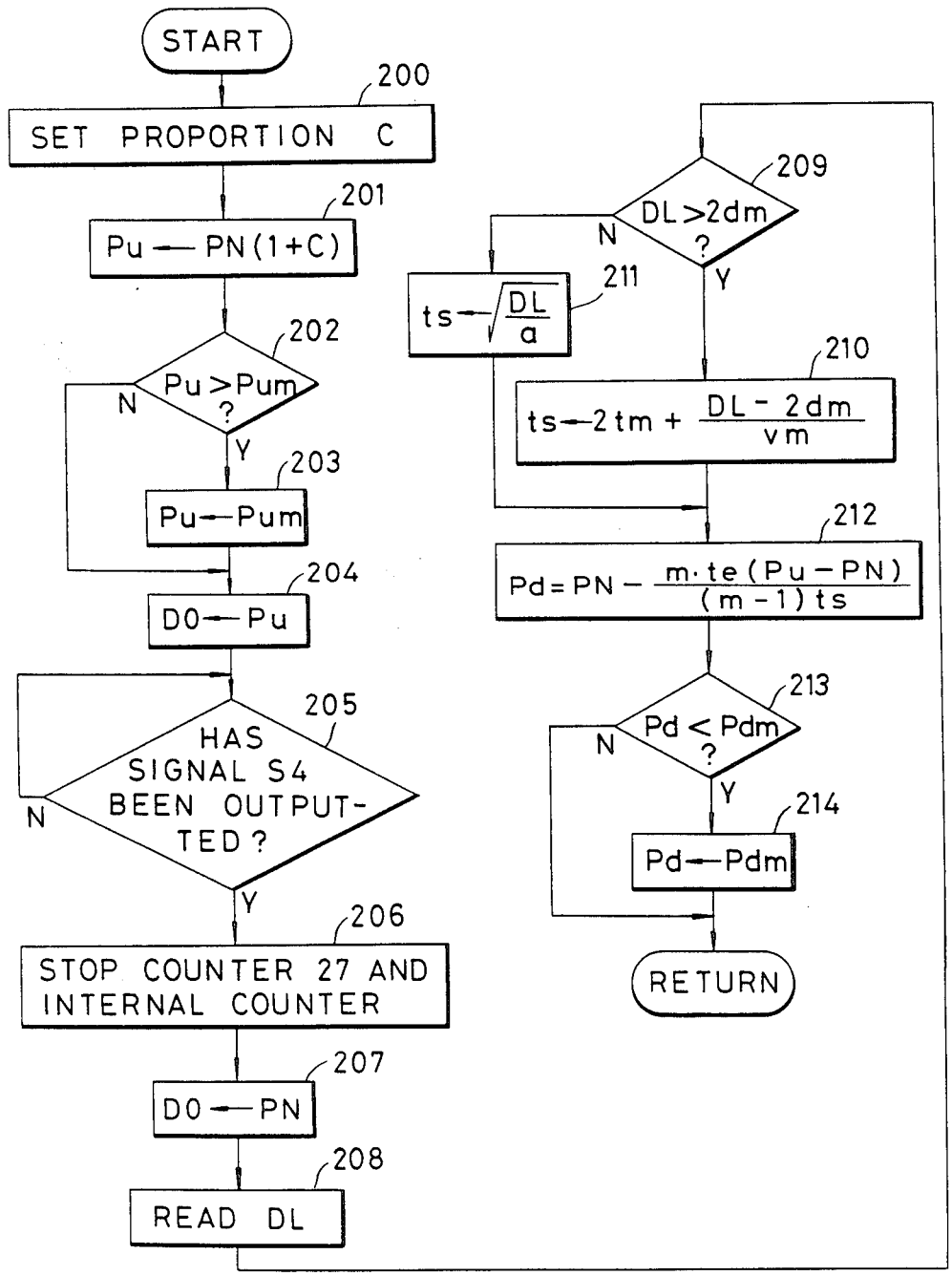
FIG. 16 is a flow chart showing the subroutine of the initialization step of FIG. 15.

While, in the above-mentioned embodiment, the steps 213 and 214 of FIG. 16 are provided to limit the lower-limit input power during the power-down period, there are instances where $P_d < P_{dm}$ results depending on the values of the exposure time $t_e$, the stepping time $t_s$ and the power-up power $P_u$. For instance, if Pu=1000 W and $t_e = t_s$ when $P_N = 500$ W, then $P_d \approx 0$ results from equation (7) when m=50.

Generally, the instantaneous minimum input power $P_{dm}$ of the mercury-vapor lamp is about ½ to ⅓ of the rated power $P_N$ and therefore the value of $P_{dm}$ is set as $P_d$ in the above-mentioned cases. If the exposure operation is effected in this condition, the average input power $P_A$ becomes greater than the rated power $P_N$.

Thus, it may be designed so that if the step 213 determines that $P_d < P_{dm}$, the step 200 makes a correction to reduce the power-up proportion C and recalculates to obtain the optimum value of the power-up power $P_u$. If this measure still proves to be ineffective, it is desirable to give a warning or switch to the ordinary exposure which prevents any flashing operation.

Also, while the power $P_u$ for the power-up period is applied according to the power-up proportion C, thus providing an input value proportional to the power, an input method may be used which increases, for example, the light intensity during the exposure several times as compared with the light intensity at the rated power $P_N$. In this case, the light intensity at the rated power $P_N$ and the light intensity during the power-up period are compared and the data $D_0$ is generated by varying its value until the ratio between the two light intensities attains the inputted preset value, thereby using the data $D_0$ corresponding to the preset light intensity as the value of the power-up power $P_u$. For this purpose, a photosensitive element for always receiving the light of the lamp 1 irrespective of the operation of the shutter 3 may advantageously be arranged between the lamp 1 and the shutter 3, for example.

Also, while, in this embodiment, the average input power $P_A$ is made equal to the rated input power $P_N$, the average input power $P_A$ may be made greater than the rated input power $P_N$ and its value is not only governed by the characteristics of the lamp 1 but is also determined by an allowable extent by which the maximum power that can be inputted continuously can exceed the rated input power $P_N$.

For instance, it is considered that if the value of m is large under the conditions where $P_N=500$ W, $P_u=1000$ W, $t_e=0.3$ sec and $t_s=0.5$ sec, the value of $P_d$ becomes about 200 W. In this case, if it is selected that $P_{dm}=250$ W, then the value of $P_d$ is set equal to 250 W and therefore the averge input power $P_A$ becomes 531 W. Thus, a control system may be incorporated such that the amount of air flow from an air-cooling fan is increased in accordance with the difference by which the average input power $P_A$ is greater than the rated input power $P_N$.

It is to be noted that in the above-mentioned embodiment, as mentioned previously, the power-up power $P_u$ and the exposure time $t_e$ may be conversely determined such that $P_d=250$ W(=$P_{dm}$). For instance, by providing $P_N=500$ W and $t_s=0.5$ sec, using an approximate equation (3a) of the equation (3) to consider that the relation of $P_u=1000$ W when $t_e=0.3$ sec is approximately inversely proportional and assuming that the exposure $K=P_u \cdot t_e=300$, then the following is obtained $$250 = 500 - t_e(P_u - 500)/0.5$$

Therefore, $t_e=0.35$ sec and $P_u=857$ W.

Further, while, in the flow chart of FIG. 16, the shutter 3 is opened temporarily and an exposure time $t_e$ is measured preliminarily before starting the exposure operation of a wafer, there are instances where this operation is not always required. For instance, it is possible to measure the exposure time $t_e$ during the first exposure or shot of a wafer, complete the computational operations shown in FIG. 16 in accordance with the value of $t_e$ before the next exposure to obtain a power-down power $P_d$ and thereby effect the power down after the second exposure or shot. In this case, while the power-down is not effected or the power-down to $P_{dm}$, for example, is effected during the interval between the first and second shots, the difference between the average input power $P_A$ and the rated input power $P_N$ within the time $T_k$ is decreased with an increase in the number of exposures m and therefore there is no great difference between the two from a practical stand point.

The light control of the apparatus shown in FIG. 8 will now be described with reference to the flow chart of FIG. 19. It is to be noted that FIG. 19 shows the exposure operation of a single wafer.

The first step 170 performs the same stepping movement of the stage as the step 162 in the case of FIG. 15.

Then, the shutter 3 requires some operation time for the interval between the time of generation of a shutter opening signal $S_2$ and the time that the shutter 3 is opened fully and the interval between the time of generation of a shutter closing signal $S_2$ and the time that the shutter 3 is closed fully. The performance characteristics of the shutter 3 in terms of the light intensity variation with respect to the wafer are as shown in FIG. 7.

Figure 19:
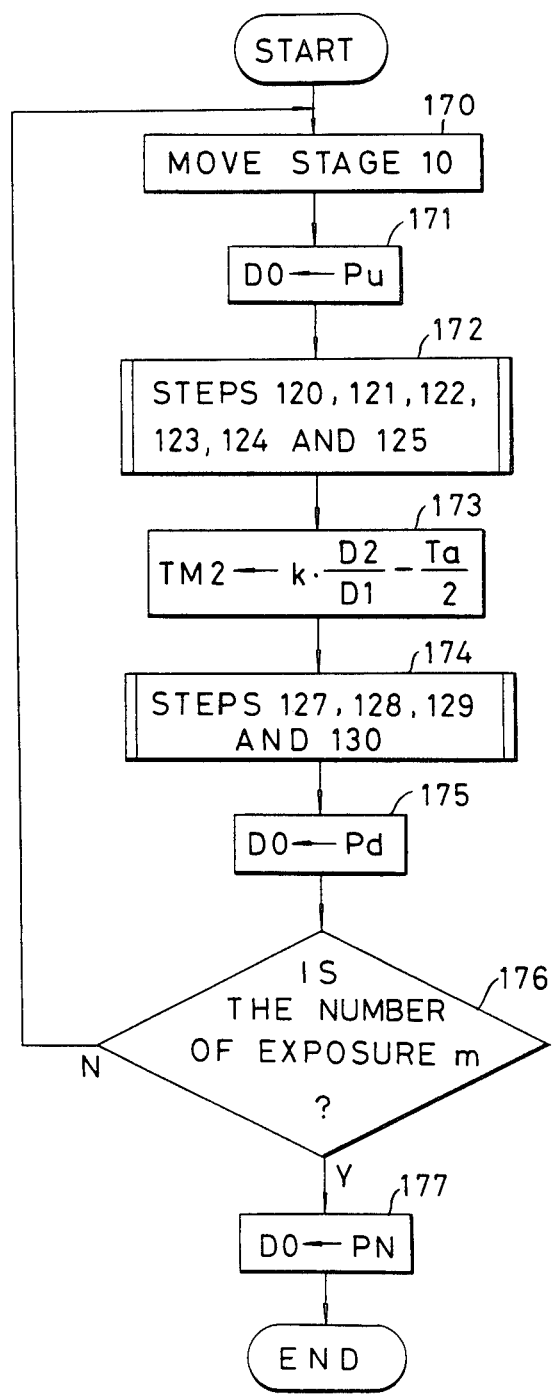
FIG. 19 is a flow chart for explaining a modification of the control operation of the light source.

While, in the flow chart of FIG. 15, the power-up operation of the lamp 1 is effected during the interval between the times $t_0$ and $t_3$, in the flow chart of FIG. 19 the power down is started simultaneously with the closing of the shutter 3 or at the time $t_2$. Thus, the light intensity characteristic on the wafer is controlled as shown in FIG. 20 so that a power-up power of 1000 W is applied during the interval between the times $t_0$ and $t_1$ and the power-down operation is started at the time $t_2$ to apply one half the rated power of 500 W or 250 W, thereby controlling the exposure $(t_3-t_2) \cdot I_2/2$ during the shutter closing operation to a very small value. Of course, the exposure time computing operations are different from those of the flow charts in FIGS. 6 and 9.

Thus, in accordance with this embodiment, the exposure during the interval between the times $t_0$ and $t_2$ is set to the proper value so that in accordance with this value $(t_1-t_0) \cdot I/2 + (t_2-t_1)I$, the full-open time $(t_2-t_1)$ is computed and the shutter 3 is closed. If the full-open time $(t_2-t_1)$ represents $T_x$, then $T_x$ is given as follows:

$$T_x = k \frac{D_2}{D_1} - \frac{T_a}{2} \qquad (8)$$

The power is increased to $P_u$ at a step 171 and the same operations as the steps 120–125 of FIG. 9 are performed at a step 172.

At a step 173, the value of $T_x$ is obtained in accordance with equation (8) and the value of $T_x$ is set in the other intenal counter TM$_2$ (not shown) of the MPU 22. A step 174 is composed of the same steps as the steps 127-130 of FIG. 9. Simultaneously with the start of the closing operation of the shutter 3, the power-down is started at a step 175. It is to be noted that in the case of the mercury-vapor lamp 1, the power-up and power-down response times are generally very short, i.e. on the order of 1 msec.

A step 176 determines whether the wafer has been exposed m times so that if it has not, the processing is repeated starting at the step 170. If the number of exposures is m a transfer is made to a step 177 where the lamp input power is restored to the rated value $P_N$ and the processing is ended.

By thus effecting the light source control, the exposure due to delay in operation of the shutter 3 during its closing operation is reduced to a very small value, with the result that even if the stepping movement of the stage 10 is started as soon as the closing of the shutter 3 is started, the amount of undesired exposure light incident on the wafer is so small that no running of the pattern image is caused. As a result, there is the advantage of starting the stepping operation earlier and reducing the total time required for exposing a single wafer m times.

In accordance with another modification of the invention, after the exposure time $t_e$ at the rated input power of the lamp 1 has been obtained, a power-up power $P_u$ required for the exposure time $t_e$ during the power-up exposure operation to attain the desired value is computed by means of a preliminary exposure or the like and then the desired power-down power $P_d$ is computed in accordance with the values $P_u$, $t_e$ and $t_s$ thereby starting the exposure of the wafer.

Still further, since the light intensity corresponding to the supplied power is obtained from the lamp 1 in the control of the exposure according to the invention, the exposure can be controlled satisfactorily by simply measuring just once the steady-state light intensity before starting the step-and-repeat exposure.

Also, where the photoresist is exposed experimentally, there is the possibility of the exposure time becoming very long. If a power-up power greater than the rated power is supplied to the mercury-vapor lamp in excess of a preset length of time, there is the danger of causing damage to the mercury-vapor lamp. Therefore, where the exposure time exceeds the preset length of time, it is necessary to control so that the power supply to the mercury-vapor lamp is switched from the power-up power to the rated power before the preset length of time is exceeded.

What is claimed is:

1. An exposure apparatus used in fabrication of semiconductor devices to control a mercury-vapor lamp for projecting light onto a substrate to be exposed, said apparatus comprising:
   (a) supply means for supplying power to said mercury-vapor lamp whereby said lamp projects light of an intensity corresponding to the power supplied thereto by said supply means;
   (b) drive means for driving said supply means; and
   (c) control means for controlling said drive means to cause said supply means to supply a first power and a second power lower than said first power to said lamp, said control means controlling said drive means in such a manner that an average power supplied to said lamp over a whole exposure cycle, including an exposure period in which said first power is supplied to said lamp and an interval between exposure periods in which said second power is supplied to said lamp, attains a predetermined value, said predetermined value being not less than a rated input power and being less than a maximum allowable instantaneous input power and said second power being not less than a minimum instantaneous input power, wherein said control means includes means for computing said second power in dependence on a ratio between said exposure period and said interval and said first power.

2. In an exposure control apparatus including a light onto an object to be exposed, and shutter means for opening and closing a light path between said light source and said object to control an amount of light to which said object is exposed, the improvement comprising:
   (a) means for detecting an intensity of the light projected from said light source through said shutter means and generating a light intensity signal indicative of said detected light intensity;
   (b) supply means for supply power to said light source whereby said light source projects light of an intensity corresponding to the power supplied thereto by said supply means;
   (c) shutter control means for controlling a closing operation performed by said shutter means whereby said light path is closed in dependence on said light intensity signal signal and for controlling an opening operation performed by said shutter means whereby said light path is opened; and
   (d) power control means responsive to said shutter control means for causing said supply means to selectively supply a first power or a second power lower than said first power to said light source, said power control means controlling said supply means in such a manner that the power supplied to said light source equals said first power in response to said shutter means opening said light path, and said power control means causing said power supply means to supply said second power to said light source in response to said shutter means closing said light path, wherein said control means controls said supply means in such a manner that an average value of power supplied to said light source over a whole period of time, including a first time period in which said first power is supplied to said light source and a second time period in which said second power is supplied, attains a predetermined value.

3. An apparatus according to claim 2, wherein said predetermined value is substantially equal to a rated input power of said light source.

4. An apparatus according to claim 2, wherein said power control means includes means for computing said second power in accordance with a ratio between said first and second time periods and said first power.

5. An exposure control apparatus provided with a mercury vapor lamp for projecting radiation onto an object to be exposed, and shutter means for opening and closing a radiation path between said mercury-vapor lamp and said object to control an amount of radiation to which said object is exposed, said apparatus comprising:
   (a) supply means for supplying power to said mercury-vapor lamp, said mercury-vapor lamp projecting radiation of an intensity corresponding to the power supplied thereto by said supply means;

(b) shutter control means for generating an opening signal and a closing signal, said shutter means being responsive to said opening signal to perform an opening operation so that said radiation path is opened and being responsive to said closing signal to perform a closing operation so that said radiation path is closed; and (c) power control means for causing said supply means to supply a first power to said mercury-vapor lamp in response to said opening operation and for causing said supply means to supply a second power, which is lower than said first power, to said mercury-vapor lamp in response to said closing operation, said power control means controlling said supply means so that said first power is more than a rated input power of said mercury-vapor lamp.

6. An apparatus according to claim 5, wherein said power control means controls said supply means so that an average power supplied to said mercury-vapor lamp over a whole cycle, including an exposure period in which said first power is supplied to said mercury-vapor lamp and an interval between said exposure periods in which said second power is supplied to said lamp, attains a predetermined value.

7. An apparatus according to claim 6, wherein said predetermined value is not less than said rated input power and is less than a maximum allowable instantaneous input power of said mercury-vapor lamp.

8. An apparatus according to claim 7, wherein said second power is not less than a minimum instantaneous input power of said mercury-vapor lamp.

9. An apparatus according to claim 5, wherein said power control means sets said first power and said second power so that an average power supplied to said mercury-vapor lamp over a whole cycle, including an exposure period in which said first power is supplied to said mercury-vapor lamp an interval between which said second power is supplied to said mercury-vapor lamp, attains a predetermined value.

10. An exposure control apparatus provided with a mercury-vapor lamp for projecting radiation onto an object to be exposed, and shutter means for opening and closing a radiation path between said mercury-vapor lamp and said object to control an amount of radiation to which said object is exposed, said apparatus comprising:

(a) supply means for supplying power to said mercury-vapor lamp, said mercury-vapor lamp projecting radiation of an intensity corresponding to the power supplied thereto by said supply means;

(b) shutter control means for generating an opening signal and closing signal, said shutter means being responsive to said opening signal to perform an opening operation so that said radiation path is opened and being responsive to said closing signal to perform a closing operation so that said radiation path is closed; and (c) power control means for causing said supply means to supply a first power to said mercury-vapor lamp in response to said opening operation and for causing said supply means to supply a second power, which is lower than said first power to said mercury-vapor lamp in response to said closing operation;

(d) said power control means setting said first power and said second power so than an average power supplied to said mercury-vapor lamp over a whole cycle, including an exposure period in which said first power is supplied to said mercury-vapor lamp and an interval between said exposure periods in which said second power is supplied to said mercury-vapor lamp, attains a predetermined value.

11. An exposure control apparatus provided with a mercury-vapor lamp for projecting radiation onto an object to be exposed, and shutter means for opening and closing a radiation path between said mercury-vapor lamp and said object to control an amount of radiation to which said object is exposed, said apparatus comprising:

(a) supply means for supplying power to said mercury-vapor lamp, said mercury-vapor lamp projecting radiation of an intensity corresponding to the power supplied thereto by said supply means;

(b) shutter control means for generating an opening signal and a closing signal, said shutter means being responsive to said opening signal to perform an opening operation so that said radiation path is opened and being responsive to said closing signal to perform a closing operation so that said radiation path is closed; and (c) power control means for causing said supply means to supply a first power to said mercury-vapor lamp in response to said opening operation and for causing said supply means to supply a second power, which is lower than said first power, to said mercury-vapor lamp in response to said closing operation, said power control means controlling said supply means so that said second power is more than a minimum allowable input power of said mercury-vapor lamp.

12. An apparatus according to claim 11, wherein said power control means sets said first power and said second power so that an average power supplied to said mercury-vapor lamp over a whole cycle, including an exposure period in which said first power is supplied to said mercury-vapor lamp and an interval between said exposure periods in which said second power is supplied to said mercury-vapor lamp, attains a predetermined value.

13. An exposure control apparatus for projecting a predetermined pattern, which is represented by radiation from a radiation source, onto each of a plurality of areas of a substrate, said apparatus comprising:

(a) shutter means for opening and closing a radiation path between said radiation source and said substrate to control an amount of radiation to which said substrate is exposed;

(b) supply means for supplying power to said radiation source, said radiation source projecting radiation of an intensity corresponding to the power supplied thereto by said supply means;

(c) shutter control means for generating an opening signal and a closing signal, said shutter means being responsive to said opening signal to perform an opening operation so that said radiation path is opened and being responsive to said closing signal to perform a closing operation so that said radiation path is closed;

(d) moving means responsive to said closing operation for moving a projected area onto which is projected said predetermined pattern from one of said plurality of areas to another of said plurality of areas; and (e) power control means for causing said supply means to supply a first power to said radiation source in response to said opening operation and for causing said supply means to supply a second power, which is lower than said first power, to said radiation source in response to said closing operation.

14. An apparatus according to claim 13, wherein said moving means moves said projected area in said interval.

15. An apparatus according to claim 14, wherein said power control means controls said supply means so that an average power supplied to said radiation source over a whole cycle, including an exposure period in which said first power is supplied to said radiation source and an interval between said exposure periods in which said second power is supplied to said lamp, attains a predetermined value.

16. An apparatus according to claim 14, wherein said radiation source has a mercury-vapor lamp, said power control means controlling said supply means so that said first power is more than a rated input power of said mercury-vapor lamp.

17. An apparatus according to claim 14, wherein said power control means sets said first power and said second power so that an average power supplied to said radiation source over a whole cycle, including an exposure in which said first power is supplied to said radiation source and an interval between said exposure periods in which said second power is supplied to said radiation source, attains a predetermined value.

18. An exposure control apparatus provided with a radiation source for projecting radiation onto an object to be exposed, and shutter means for opening and closing a radiation path between said radiation source and said object to control an amount of radiation to which said object is exposed, said apparatus comprising:
 (a) supply means for supplying power to said radiation source, said radiation source projecting radiation of an intensity corresponding to the power supplied thereto by said supply means;
 (b) shutter control means for generating an opening signal and a closing signal, said shutter means being responsive to said opening signal to perform an opening operation so that said radiation path is opened and being responsive to said closing signal to perform a closing operation so that said radiation path is closed; and
 (c) power control means for causing said supply means to supply a first power to said radiation source prior to the opening of said shutter means and for causing said supply means to supply a second power, which is lower than said first power, to said radiation source following a termination of the closing of said shutter means, said power control means controlling said supply means so that said second power is more than a minimum power which permits said radiation source to maintain projecting radiation.

19. An apparatus according to claim 18, wherein said power control means controls said supply means so that an average power supplied to said radiation source over a whole cycle, including an exposure period in which said first power is supplied to said radiation source and an interval between said exposure periods in which said second power is supplied to said lamp, attains a predetermined value.

20. An apparatus according to claim 19 wherein said predetermined value is less than a maximum which permits said radiation source to maintain projecting radiation.

21. An apparatus according to claim 18, wherein said power control means sets said first power and said second power so that an average power supplied to said mercury-vapor lamp over a whole cycle, including an exposure period in which said first power is supplied to said radiation source and an interval between which said second power is supplied to said radiation source, attains a predetermined value.

* * * * *